United States Patent
Love et al.

(10) Patent No.: US 6,449,193 B1
(45) Date of Patent: Sep. 10, 2002

(54) BURST ACCESS MEMORY SYSTEM

(75) Inventors: Andrew Love, Sugarland, TX (US); Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,727

(22) Filed: Dec. 3, 2001

Related U.S. Application Data

(60) Provisional application No. 60/258,361, filed on Dec. 28, 2000.

(51) Int. Cl.[7] .................................. G11C 7/00
(52) U.S. Cl. .............. 365/189.01; 365/230.01
(58) Field of Search ................. 365/189.01, 230.01, 365/189.05, 230.08

(56) References Cited

U.S. PATENT DOCUMENTS 6,026,465 A * 2/2000 Mills et al. ................. 711/103
6,272,064 B1 * 8/2001 Wilford et al. ........ 365/230.08

* cited by examiner

*Primary Examiner*—Vu A. Le
(74) *Attorney, Agent, or Firm*—Robert D. Marshall, Jr.; W. James Brady, III; Frederick J. Telecky, Jr.

(57) ABSTRACT

A more efficient memory access is provided by providing fast access to words on the same physical row (wordline) in memory whether sequential or not, by, after issuance of an address, the detection of whether the current access is on the same physical memory row as the previous access and accordingly allows a different number of wait states, dependent on whether the access is on the same row or not.

3 Claims, 4 Drawing Sheets

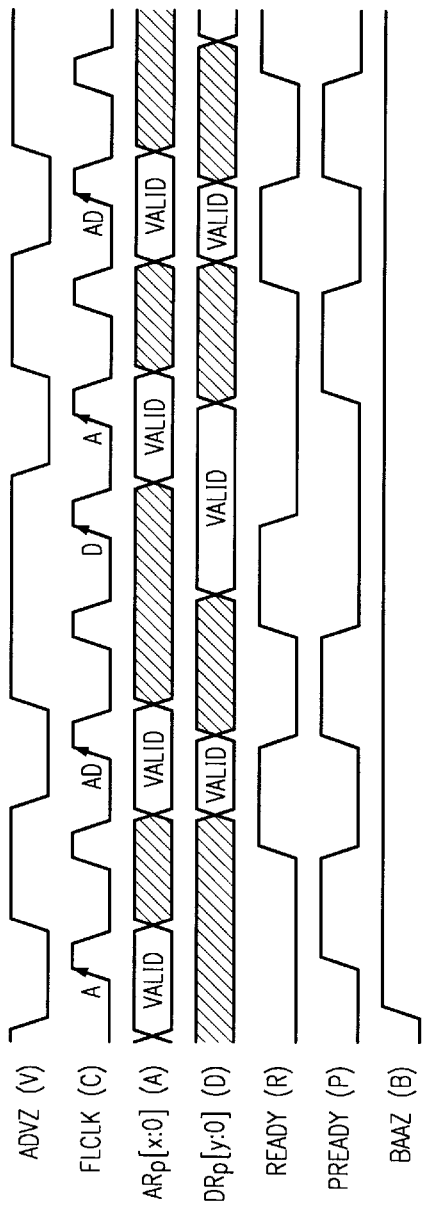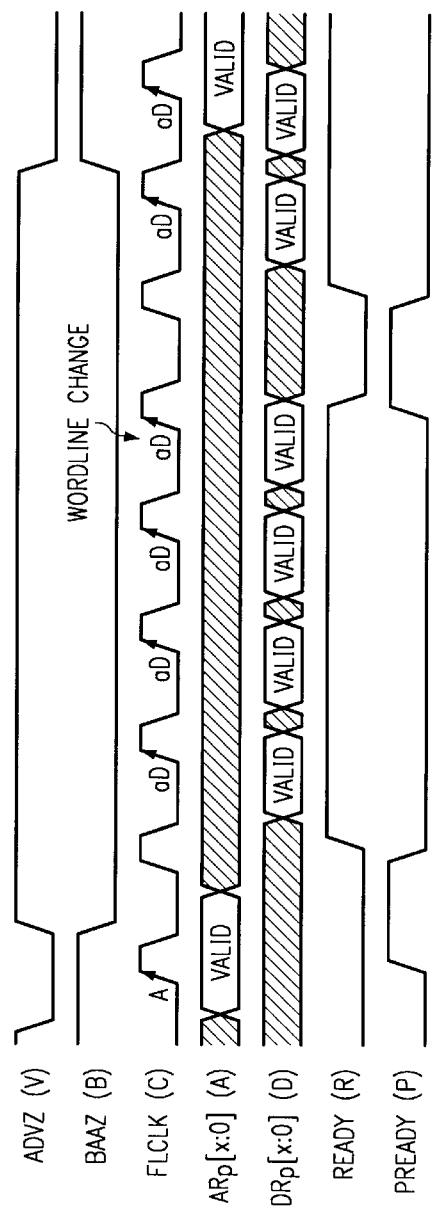

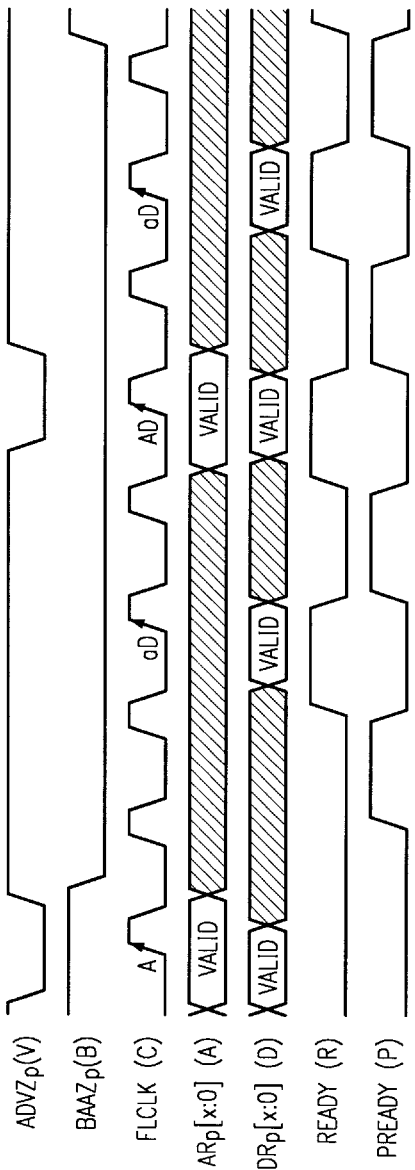
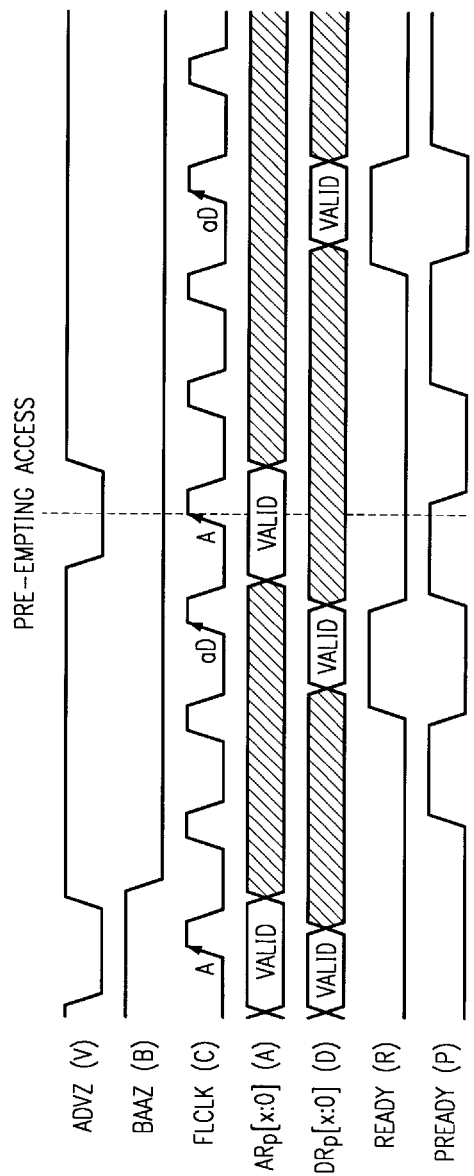

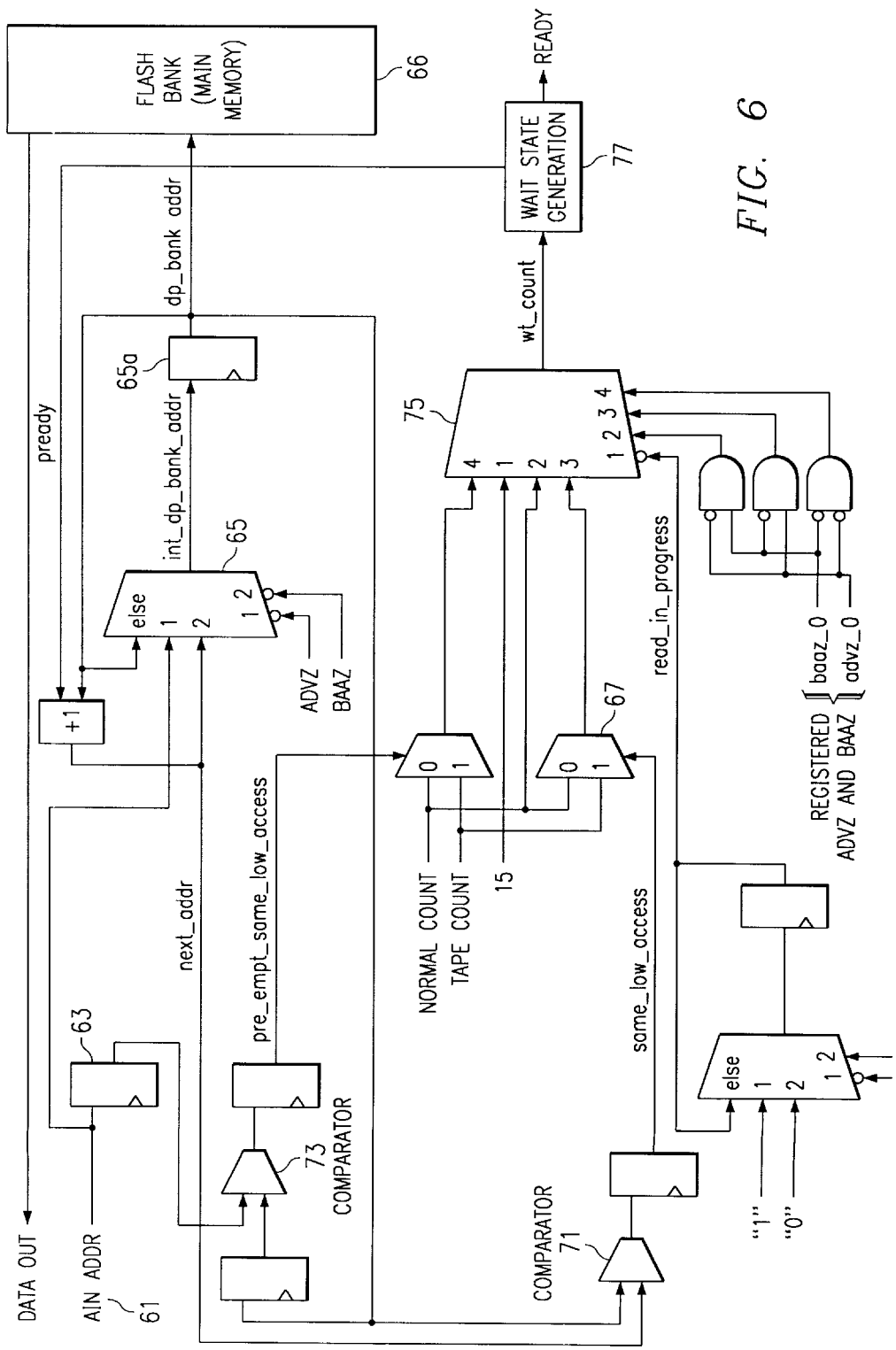

BURST ACCESS MEMORY SYSTEM

This application claims priority under 35 USC §119(e)(1) of Provisional Application No. 60/258,361, filed Dec. 28, 2000.

FIELD OF INVENTION

This invention relates to memory access and more particularly to an improved burst access operation to include fast access to words on the same row (wordline) in memory.

BACKGROUND OF INVENTION

A flash memory bank has a dedicated synchronous read port interface which facilitates read access from main flash memory. Referring to FIG. 1 there is illustrated a block diagram of a flash memory bank 21 and a read interface (control logic) 10 responsive to signals from an interface bus which communicates with the host. The interface bus consists of an address bus, a data bus, and several control signals. The width of the address bus is dependent on the number of words in the associated flash and the width of the data read port interface. A host provides an address AR and an address valid signal ADVZ for standard accesses. Standard read refers to random accesses anywhere in the address space of the flash bank. A read port interface synchronizes the access to the system clock SYSCLOCK. Two ready signals (READY and PREADY), one a pipelined version of the other, are generated in the read port interface, to signal that data is available to the host. The flash bank read interface has internal wait state generation to create these signals. All outputs from the read ports are generated on the rising edges of the system clock with the exception of the output data. Output data is passed directly from the flash bank to the bus interface.

Table 1 shows the read port signals. In the prior art this port supports two modes of read operations: standard and burst. Burst according to the prior art read refers to a mode in which sequential addresses are generated in the read port interface. Burst read enables the potential for a higher data rate when accesses occur on the same wordline within the flash bank, increasing system performance. Access time within the flash bank can be faster within a wordline (also called page) because the same wordline drive is active as the previous access. If the access is from a different wordline the current wordline must be deactivated and a different wordline activated, which takes a finite amount of time which is longer than an access from the same page. Burst reads are enabled by an additional control input, BAAZ. When burst is active the flash read port interface generates subsequent addresses, including transitions across wordline boundaries (the read port interface automatically adds wait states, as needed). In the read port interface implementation there are two wait state counters, one for a normal read which may occur on any wordline randomly, and one for a page read which occurs on the same wordline as the previous read. The page read wait state count is typically smaller than the normal read wait state count.

TABLE 1

| Name | I/O | Function |
|---|---|---|
| SYSCLOCK | I | System Clock |
| ADVZ | I | address Valid, active low. Indicates a valid and stable input address on bus AR [x:0]. |
| AR[x:0] | I | Read address. x = 1 - number of read address bits required for each bank. |
| BAAZ | I | Burst Address Advance, active low. |
| DR[y:0]~ | O | Read data bus. y = 15, 31, or 63 for data bus widths of 16, 32, or 64 bits, respectively. There is no output enable for this bus, thus it is never high impedance. Note that this bus originates at the flash bank, not the read port interface. |
| PREADY | O | Pipelined Ready, active high. This is a pipelined version of the READY. signal except for when in 0 wait states PREADY remains low. |
| READY | O | Data Ready, active high. When active the system may latch the data on the rising edge of the flash system clock. This signal is inactive while wait states are inserted during reads or when the bank is owned by the state machine for a program or erase operation, during reset, and until the module is stable upon release of system reset. |

As previously mentioned, standard (random access) and burst access (read port interface generates sequential accesses with address override) are supported. Module data outputs, DR(y:0) busses, are driven by the banks directly.

The flash module standard read timing is shown in FIG. 2. The read is synchronous, requiring the flash system clock and an Address Valid (ADVZ) to properly time wait state generation and ready signal synchronization. The clock is input via the control port. The flash read port interface latches the address on the rising edge of the clock while ADVZ is active low. The clock rising edge triggers the wait state counter. Once the number of wait states has elapsed READY goes high for one clock cycle. READY, when active high, allows the host to latch output data on the next rising edge of the clock. The READY signal becomes active for one cycle after the required number of wait states have been inserted. All standard reads use the WTREAD count for wait state generation. This is the normal read wait state count. The example in FIG. 2 has two wait states. In the example, the latched address bus internal to the read port interface is shown for reference, as are the arrows on SYSCLOCK, which shows when addresses and/or data are latched. A pipelined version of READY called PREADY is also generated in the read port interface. PREADY is active the clock cycle before READY is active when the number of wait states is one or greater. Note that for zero wait states PREADY will always remain low.

A standard burst operation, especially in slower memories such as flash or FeRAM, allows sequential accesses on the same physical row in memory to be accessed faster than a random access because the wordline does not need to be activated before the read, as previously stated. It is activated from the prior read. In the prior art this kind of address generation is done to allow sequential accesses only if the memory locations are accessed in consecutive order. It is desirable to provide a system where the addresses need not be consecutive, but only on the same wordline.

SUMMARY OF INVENTION

In accordance with one embodiment of the present invention an interface allows, after issuance of an address, the detection of whether the current access is on the same physical memory row as the previous address, and accordingly allows a different number of wait states, depending on whether the access is on the same row or a different row. In accordance with an embodiment, the faster access time is available if the address for the current access is either generated by a counter in the interface or supplied by a host system on the address input to the interface. The host system provides a control signal to the interface to select whether the memory interface should use the address from the counter or from the interface's address input.

DESCRIPTION OF DRAWINGS

FIG. 2 illustrates a standard read that is continuous with two wait states;

FIG. 4 illustrates special burst read (Standard-2 waits, Page-1 wait);

FIG. 5 illustrates special burst read (Standard-1 wait, Page-0 wait);

FIG. 6 illustrates the control logic according to a second preferred embodiment of the present invention with pre-emptive access; and FIG. 7 illustrates special burst read with address pre-empting (Standard-2 waits, Page-1 wait).

DESCRIPTION OF PREFERRED EMBODIMENTS

Figure 1:
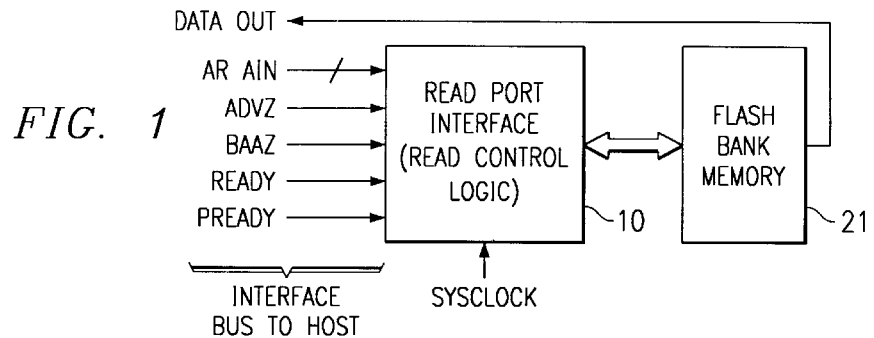
FIG. 1 is an overall block diagram of a read access system.
Figure 3:
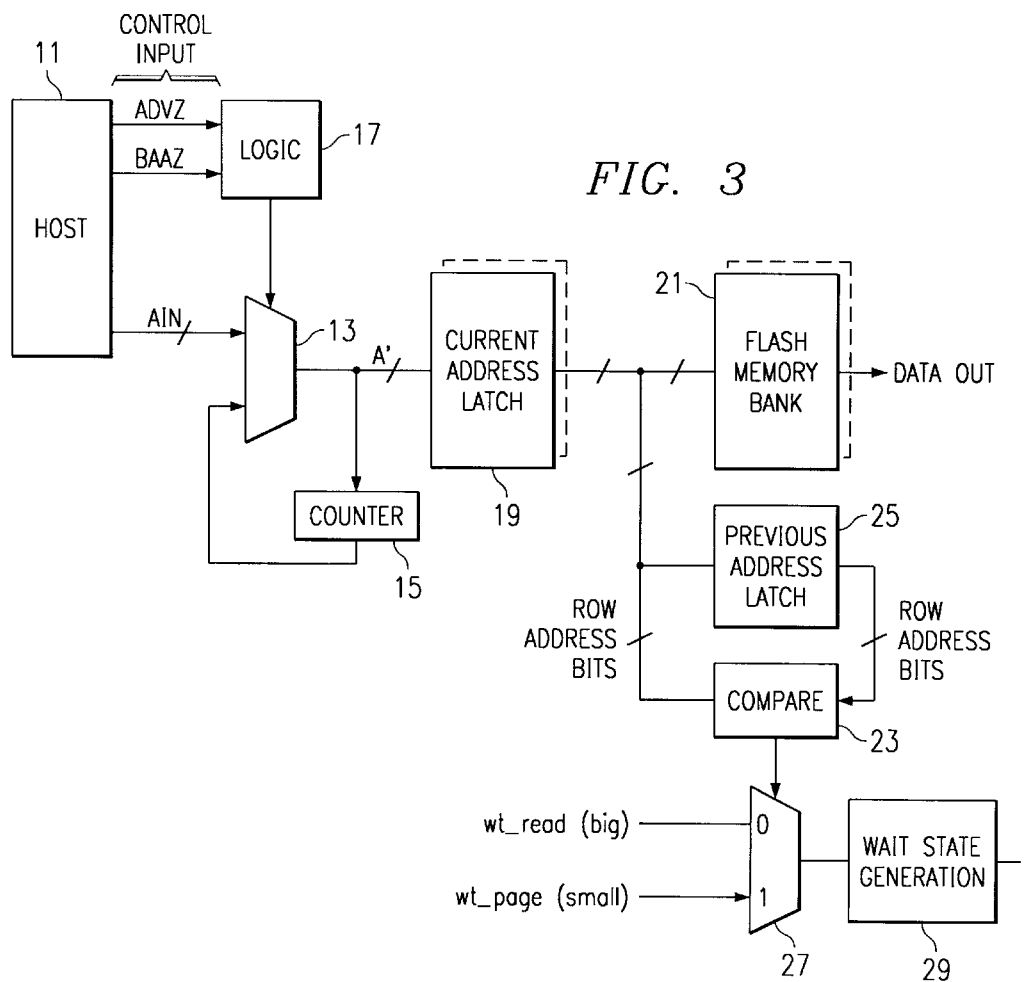
FIG. 3 is a block diagram of a system according to one embodiment of the present invention.

Referring to the block diagram of the system of FIG. 3 accordingly to one embodiment of the present invention the host 11 provides an address AIN to a multiplexer 13. The multiplexer 13 output A1 is applied to a counter 15 that increments the address. The output of the counter 15 is the other input to the multiplexer 13 such that the address output A1 from the multiplexer is provided either from the counter 15 or Address AIN directly from the host 11. The control input ADVZ (address valid) and BAAZ (burst address advance) from the host is applied to logic 17 that controls the multiplexer 13. The address A1 from the multiplexer 13 is applied to a current address latch 19 for the flash memory bank 21. The row address bits output of the current address latch 19 are applied to a comparator 23. The previous row address bits from the previous address is stored in previous address latch 25. The output from the previous row address latch 25 is also applied to comparator 23. The row address bits of the current address is compared to the row address bits of the previous address in the comparator 23 to determine if there is a match. A multiplexer gate 27 is controlled by the output of the comparator 23. The input to the multiplexer 27 is a signal indicating the need for either the normal or page number of wait states. If there is a match at comparator 23 a logic '1' corresponding to page wait state count signal condition is provided to wait state generator 29 to provide the appropriate wait time for the special bust access for the READY and PREADY signal generation. If there is not a match a logic '0' is provided to the generator 29 and appropriate wait time is provided for the full normal address for the READY and PREADY signals. This circuit provides the logic to determine if there is a row match or not, and hence, to produce READY and PREADY signals at the appropriate time.

In special burst access read the read port interface synchronously generates addresses while BAAZ, Burst Address Advance, is active low, unless ADVZ is also active low during a rising edge of the system clock. If ADVZ is also low then the address present on the input address bus supersedes the address which would have been generated by the read port interface. The automatic address generation can only occur after an initial address has been latched into the read port interface read port interface. This is accomplished with the first ADVZ pulse, regardless of the state of BAAZ.

Special burst access mode has an advantage over standard read in that if the sequential or input address is on the same physical row in the flash bank as the previous access then the wait states are based on the page mode, WTPAGE, number of wait states. which may be less than the wait states for a standard read. If the next access is from the subsequent row then the wait states are based on the standard read, WTREAD, number of wait states. Dividing the number of bits per wordline by the width of a word determines the number of words which may be read in a page with the page number of wait states.

The first access to the bank may be either a standard read access or a special burst read access. In fact, BAAZ can be active 100% of the time. If a burst access, the read port interface determines whether it is the first or a subsequent access, to correctly set the number of wait states.

If BAAZ is modulated during read operation then any transitions it makes must occur before the rising edge of clock which follows the rising edge in which the address is latched in. This is regardless of the number of wait states in either standard or page read modes. Otherwise, BAAZ may be kept high or low at all times.

FIG. 4 is an example of special burst read and shows a burst access crossing a wordline boundary. This example has one wait state in random access mode and no wait states in burst mode.

Another example of special burst access read timing is shown in FIG. 5. In this mode the addresses while burst mode is active, BAAZ is low, are generated, but, in addition, it shows a rising edge of clock occurring while both BAAZ and ADVZ are active low. In this case the address counter is superseded by the address on the input address bus. The appropriate number of wait states for the access is inserted by the read port interface depending on whether new address is on the same page or not. This allows a host to achieve page mode data rates while randomly addressing data if it is on the same wordline as the previous access. The example in FIG. 5 shows a standard access (two wait states) followed by a sequential burst access from the same wordline (one wait state). This if followed by another standard access which happens to be on the same wordline (one wait state) which is, in turn, followed by a sequential burst access, still on the same wordline (one wait state).

Referring to FIG. 6 there is illustrated the control logic according to a preferred embodiment of the present invention wherein the read port also supports pre-emptive data access. Pre-emptive data access means that a new address is put on the input to begin a new access before the previous access has completed. For example, the host may request data at address 10 two wait states into a four wait state address cycle in which data for address 5 was being accessed. The system includes and address input AIN 61 and latch 63 adapted to receive address signals from the interface bus. The direct address at input 61 is applied to logic 65 for accessing the memory bank 66. ADVZ and BAAZ control signals are applied to logic 65 to gate the address to the memory bank 66. The current address is compared to the next address at comparator 71. The comparator 71 determines if the next address and the current address are in the same row to generate the same row access signal. If not, gate 67 gates the normal count to the wait state logic 75 that provides the correct wait count to wait generator 77. If there is a same row access then the page count is gated from gate 67 to the logic 75 and the appropriate count is provided from the wait state generator 77. A second comparator 73 is responsive to the current address and the address from latch 63 to determines if the pre-empt access is from the same row. If not, the normal count is provided to logic 75 and with the presence of the correct ADVZ to deliver the correct wait count to wait count generator 77 when the prior read is no longer in progress as determined by the input to logic 75. Likewise, a page count is provided when the read is from the same row. While READY is low during a standard or page access, a new address may be issued by taking ADVZ low. This causes a new access to be initiated before the previous access completed. If in burst mode and at least one access has completed on the current row and the pre-empting address is on the same row then the page mode number of wait states will be inserted. If an access has not been completed on a row since the last row change and the pre-empting address is on the same row then the standard read number of wait states is inserted. If the pre-empting address is on a different row than the current row then the standard read number of wait states will be inserted. If pre-empting is utilized note that the generation of READY and PREADY signals will be affected and the host must comprehend their behavior. The behavior of READY and PREADY can be determined from the previous examples. FIG. 7 illustrates access pre-empting. Pre-empting may also be used in standard read mode, but the WTREAD number of wait states will always be used for the access.

In the claims:

1. A method of accessing a memory to provide fast access to words on the same row in memory comprising the steps of:

detecting whether the current address is on the same physical memory row as a previous address;

providing a counter of consecutive addresses in a row and detecting the presence of a first control signal that calls for the addresses from a counter for providing the incrementation of addresses from the counter and detecting the presence of a second control signal for providing random row address within a wordline from a host; and generating a different number of wait states depending on whether the access is on the same or different row.

2. The method of claim 1 wherein said detecting steps includes storing previous address bits and comparing the previous row address bits with the current row address bits.

3. The method of claim 1 wherein the detecting step includes determining if a new preemptive access is on the same wordline before the previous address is completed.

* * * * *